United States Patent
Kuznicki

(10) Patent No.: US 11,437,532 B2
(45) Date of Patent: Sep. 6, 2022

(54) METHOD FOR THE PRODUCTION OF A LIGHT-TO-ELECTRICITY CONVERTER MADE ENTIRELY FROM SILICON FOR A GIANT PHOTOCONVERSION

(71) Applicant: SEGTON ADVANCED TECHNOLOGY, Versailles (FR)

(72) Inventor: Zbigniew Kuznicki, Hoenheim (FR)

(73) Assignee: SEGTON ADVANCED TECHNOLOGY, Versailles (FR)

( * ) Notice: Subject to any disclaimer, the term of this patent is extended or adjusted under 35 U.S.C. 154(b) by 419 days.

(21) Appl. No.: 16/618,421

(22) PCT Filed: Jun. 4, 2018

(86) PCT No.: PCT/FR2018/000155
§ 371 (c)(1),
(2) Date: Apr. 24, 2020

(87) PCT Pub. No.: WO2018/220299
PCT Pub. Date: Dec. 6, 2018

(65) Prior Publication Data
US 2020/0259027 A1    Aug. 13, 2020

(30) Foreign Application Priority Data
Jun. 1, 2017 (FR) ..................... 1700583

(51) Int. Cl.
*H01L 31/0352* (2006.01)
*H01L 31/0216* (2014.01)
(Continued)

(52) U.S. Cl.
CPC ........... *H01L 31/035245* (2013.01); *H01L 31/02167* (2013.01); *H01L 31/0747* (2013.01);
(Continued)

(58) Field of Classification Search
CPC ....... H01L 31/035245; H01L 31/02167; H01L 31/0747; H01L 31/202; H01L 31/208;
(Continued)

(56) References Cited

U.S. PATENT DOCUMENTS 5,935,345 A * 8/1999 Kuznicki ............ H01L 31/1804
438/97
9,520,515 B2   12/2016 Kuznicki et al.
(Continued)

FOREIGN PATENT DOCUMENTS

FR   2 722 612 A1   1/1996
FR   2 801 726 A1   6/2001
(Continued)

OTHER PUBLICATIONS

International Search Report and Written Opinion dated Feb. 13, 2019 in corresponding application No. PCT/FR2018/000155; w/ English partial translation and partial machine translation (14 pages).
(Continued)

*Primary Examiner* — Earl N Taylor
(74) *Attorney, Agent, or Firm* — Seckel IP, PLLC

(57) ABSTRACT

The production process according to the invention consists of a nanometric scale transformation of the crystalline silicon in a hybrid arrangement buried within the crystal lattice of a silicon wafer, to improve the efficiency of the conversion of light into electricity, by means of hot electrons. All the parameters, procedures and steps involved in manufacturing giant photoconversion cells have been tested and validated separately, by producing twenty series of test devices.

Figure 1:
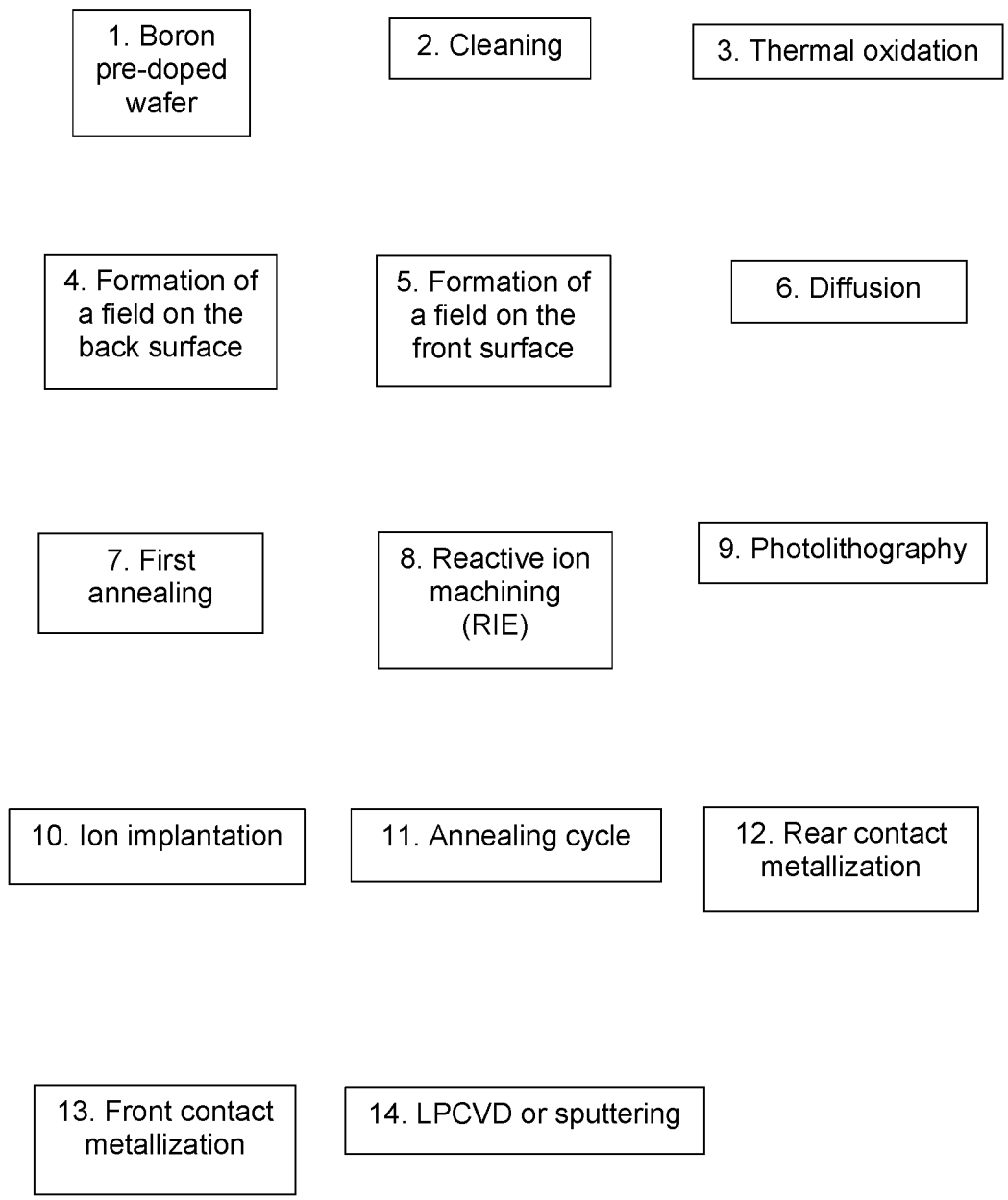

An example of the technology consists of manufacturing a conventional crystalline silicon photovoltaic cell with a single collection junction and completing the device thus obtained by an amorphizing ion implantation followed by a post-implantation thermal treatment.
(Continued)

| # | Operation | Description |
|---|---|---|
| 1 | c-Si | Crystalline silicon wafer |
| 2a | c-Si (p-type) | Low or moderate homogeneous p doping |
| 2b | c-Si (p-type) | Back surface p doping creating a BSF |
| 3 | c-Si (n-type) | High non-linear n doping by diffusion of the surface source; creation of an internal generator with membrane as PN junction |
|   | c-Si (p-type) | |
| 4 | c-Si (n-type) | Conditioning of the surface before the implantation sequence |
|   | c-Si (p-type) | |
| 5 | a*-Si (n-type) | Amorphizing ionic implantation through a mask which creates an buried substructure (a-Si) |
|   | c-Si (p-type) | |
| 6 | a**-Si (n-type) | Solid phase epitaxy resulting from an annealing cycle (a-Si) |
|   | c-Si (p-type) | |
| 7 | <c-Si> nanolayers | Conditioning of the segtons in the seg-matter |
|   | c-Si (p-type) | |
| 8 | c-Si (p-type) | Electronic passivation – metallization – light trapping |

The modulation of the crystal, specific to the giant photoconversion, is then carried out on a nanometric scale in a controlled manner to obtain SEGTONs and SEG-MATTER which are active both optically and electronically, together with the primary conversion of the host converter.

21 Claims, 3 Drawing Sheets

(51) Int. Cl.
  *H01L 31/0747*  (2012.01)
  *H01L 31/20*    (2006.01)
  *H01L 31/18*    (2006.01)

(52) U.S. Cl.
  CPC ........ *H01L 31/1804* (2013.01); *H01L 31/202* (2013.01); *H01L 31/208* (2013.01)

(58) Field of Classification Search
  CPC ....... H01L 31/035254; H01L 31/03762; H01L 31/03845; H01L 31/068; H01L 21/26513; H01L 31/1804; Y02E 10/547; Y02E 10/548; Y02P 70/50; B82Y 40/00; G02B 1/002
  See application file for complete search history.

(56) References Cited

U.S. PATENT DOCUMENTS

| | | | |
|---|---|---|---|
| 9,711,674 B2 | 7/2017 | Kuznicki et al. | |
| 9,722,121 B2 | 8/2017 | Kuznicki et al. | |
| 10,020,408 B2* | 7/2018 | Kuznicki | H01L 31/03762 |
| 10,886,422 B2* | 1/2021 | Kuznicki | H01L 31/03762 |
| 10,971,642 B2 | 4/2021 | Kuznicki et al. | |
| 11,329,180 B2 | 5/2022 | Kuznicki et al. | |
| 2016/0099368 A1* | 4/2016 | Kuznicki | H01L 31/035236 136/255 |
| 2016/0118517 A1* | 4/2016 | Kuznicki | G02B 1/002 136/261 |
| 2016/0155869 A1* | 6/2016 | Kuznicki | H01L 31/0352 257/53 |
| 2016/0211398 A1* | 7/2016 | Kuznicki | H01L 31/055 |

FOREIGN PATENT DOCUMENTS

| | | | | |
|---|---|---|---|---|
| FR | 3 005 789 A1 | 11/2014 | | |
| FR | 3005789 A1 * | 11/2014 | | G02B 1/002 |
| FR | 3008828 A1 * | 1/2015 | | H01L 31/028 |
| FR | 3010231 A1 * | 3/2015 | | H01L 31/02168 |
| FR | 3067168 A1 * | 12/2018 | | H01L 31/035245 |
| JP | S57-132373 A | 8/1982 | | |
| WO | WO-2015008161 A2 * | 1/2015 | | H01L 31/028 |

OTHER PUBLICATIONS

Trzmiel et al., "Dielectric spectroscopy investigations of nanostructured silicon", Current Applied Physics, vol. 14, No. 8, 2014, pp. 991-997 (in English; D3 cited in the ISR).

Le Perchec et al., "19.3% Efficiency on P-Type Silicon Solar Cells by Pulsion Plasma-Immersion Implantation", Energy Procedia, vol. 33, 2013, pp. 18-23 (in English; D5 cited in the ISR).

Schlemm, "Compact broad beam ion implantation of 25 keV N/sup +/ in silicon", Proceedings of the 11th International Conference on Ion Implantation Technology, Austin, TX, USA, Jun. 16-21, 1996, IEEE, New York, NY, USA, pp. 400-403 (in English; D6 cited in the ISR).

Szlufcik et al., "Low-Cost Industrial Technologies of Crystalline Silicon Solar Cells", Proceedings of the IEEE, vol. 85, No. 5, 1997, pp. 711-730 (in English; D7 cited in the ISR).

Ali et al., "Process optimization of doping conditions for (100) P-type monocrystalline silicon solar cell using response surface methodology", Journal of Photonics for Energy, vol. 3, No. 1, 2013, pp. 32099-1-32099-8 (in English; D8 cited in the ISR).

Young et al., "Plasma Immersion Ion Implantation for Interdigitated Back Passivated Contact (IBPC) Solar Cells", 2016 IEEE 43rd Photovoltaic Specialists Conference (PVSC), IEEE, New York, NY, USA, Jun. 5, 2016, pp. 225-229 (in English; D9 cited in the ISR).

* cited by examiner

FIG. 2

| # | Operation | Description |
|---|---|---|
| 1 | c-Si | Crystalline silicon wafer |
| 2a | c-Si (p-type) | Low or moderate homogeneous p doping |
| 2b | c-Si (p-type) | Back surface p doping creating a BSF |
| 3 | c-Si (n-type) | High non-linear n doping by diffusion of the surface source; creation of an internal generator with membrane as PN junction |
| 3 | c-Si (p-type) | |
| 4 | c-Si (n-type) | Conditioning of the surface before the implantation sequence |
| 4 | c-Si (p-type) | |
| 5 | a*-Si (n-type) | Amorphizing ionic implantation through a mask which creates an buried substructure (a-Si) |
| 5 | c-Si (p-type) | |
| 6 | a**-Si (n-type) | Solid phase epitaxy resulting from an annealing cycle (a-Si) |
| 6 | c-Si (p-type) | |
| 7 | <c-Si> nanolayers | Conditioning of the segtons in the seg-matter |
| 7 | c-Si (p-type) | |
| 8 | c-Si (p-type) | Electronic passivation – metallization – light trapping |

METHOD FOR THE PRODUCTION OF A LIGHT-TO-ELECTRICITY CONVERTER MADE ENTIRELY FROM SILICON FOR A GIANT PHOTOCONVERSION

The invention relates to a process for manufacturing all-silicon light-to-electricity converters with nanoscopic systems, in specific arrangements within the monocrystalline silicon to trigger a giant photoconversion.

This production process includes the nanoscopic modulation of silicon, and makes it possible to avoid the conflicts resulting from the successive manufacturing steps by superposition of the different phases of silicon transformation, while respecting adjusted geometric factors.

More particularly, the manufacturing process includes a local modification of the silicon crystal lattice into a new nanoscale arrangement to form a specific system, so as to improve the efficiency of the light-to-electricity conversion using the all-silicon converters. This involves the exploitation of the kinetic energy of hot electrons, which has become possible thanks to the mechanisms of the giant photoconversion (GPC, English acronym for Giant PhotoConversion); mainly, the low-energy generation and multiplication of secondary electrons.

1. FIELD OF THE INVENTION

The present invention relates and extends to the field of conversion of light energy into electricity, and in particular to all applications to light-to-electricity converters, photoelectric cells and photovoltaic solar cells with high efficiency. It involves in particular a process of manufacturing a new photovoltaic material, and photovoltaic devices using it having very high efficiency thanks to giant photoconversion.

The present production process utilizes photovoltaic industry equipment with two additional stations dedicated to specific operations implementing complementary processes for the manufacture of monocrystalline silicon photovoltaic cells.

The resulting converter can be used to form photovoltaic panels electrically connected in series or in parallel in appropriate circuits, as well as in the form of sheets, mats or mattresses.

2. DEFINITIONS

The definitions below will be used throughout the following description.

Metamaterial: this term refers to an artificial material, in particular transformed crystalline silicon, having physical properties that go beyond the known, so-called natural properties. The metamaterial retains its original chemical composition. More specifically, it takes the form of at least one continuous or discontinuous layer, but also a field of beads or grains or various shapes, such as agglomerates or aggregates, which allows a low-energy generation and multiplication of secondary electrons, a specific electronic transport, an increased sensitivity to the intensity of light excitation, and a strong optical nonlinearity.

SEGTON: [Acronym for Secondary Electron Generation Tuned on Nanoscale] is a conditioned elemental unit of the crystalline lattice, characterized by its original system of electron energy levels, which is very well suited to the multistage conversion of light into electricity. SEGTON allows the low-energy generation and multiplication of secondary electrons that are additional to the primary photogeneration of the free carriers.

SEG-MATTER [acronym for Secondary Electron Generation-Matter] is a metamaterial, i.e., the specific crystalline material created in a single nanospace of the conjugated interactions: of structure, of doping, of electron transport and of strong physical fields for efficient light-to-electricity conversion, which contains homogeneously distributed elementary units called SEGTONS that form an ordered super-lattice immersed in a specific physical environment delimited by nanomembranes. A new crystallinity brings desired complementary functionalities on a nanometric scale.

More generally, this expression also refers to the production process for manufacturing the material capable of exploiting a set of energy levels of the SEGTONs.

Nanomembrane: it is a heterointerface or a surface (vertical, horizontal, parallel to the surface, more or less spherical or not) on which is made a change of the model of electron energy band, of conduction mode, and so on. This is, for example, the interface between two crystalline silicon phases: the SEG-MATTER and the surrounding untransformed natural silicon, which is characterized by the modification of the electron transport mode.

MTM: silicon-based metamaterial a-Si: amorphized silicon

<a-Si>: amorphized phase of the silicon under mechanical stress c-Si: crystalline silicon <c-Si>: crystalline phase of the silicon under mechanical stress Vacancy: point structural defect in a crystal lattice.

Divacancy: point structural defect in a crystalline lattice formed by two interconnected vacancies, forming a specific structural unit.

BSF: electric field at the back surface, i.e., an LH-type junction resulting from a gradual or abrupt modification of the density of doping impurities.

RIE: reactive ion etching.

LPCVD: low pressure chemical vapor deposition.

Amorphized nanoaggregates: amorphized aggregates or nanogroups of the locally transformed crystalline material, preferably silicon, which has been included by any suitable production process in the crystalline medium.

Inserted nanostructures: amorphized nanoaggregates, enveloped by a nanolayer of SEG-MATTER, i.e., of the metamaterial (MTM) capable of providing many secondary electrons resulting from collisions of hot electrons, optimally distributed within the converter, preferably the emitter.

GPC: Giant PhotoConversion—giant photoconversion allowing the optimal exploitation of the energy of the whole solar spectrum.

3. BACKGROUND OF THE INVENTION

Currently, the manufacture of commercial photovoltaic devices is based on transformations of a semiconductor, for example doping with impurities, forming PN junctions, metallization, electronic passivation, anti-reflective arrangements.

The rather simple conventional architecture of a photovoltaic cell exploits natural materials that can only be modified to a limited extent. A very large proportion of the cells is designed as a semiconductor device with a single planar collection junction.

This vision can be enriched by the creation of dedicated sub-regions, subsystems, substructures, which complement on a nanometric scale the conventional design of the architecture of photovoltaic devices.

Years of multiple experiments have made it possible to implement methods of modulating the semiconductor material (mainly silicon) on a nanometric scale, so as to achieve new phenomena related to giant photoconversion.

The state of the art is widely illustrated and documented by the publication of prior patent applications filed in particular in the name of the company SEGTON AdT.

4. PROBLEM RESOLVED BY THE INVENTION

The adjustment of a light-to-electricity converter to a larger portion of the solar spectrum is complicated, on the one hand, because, for reasons of quantum mechanics, the conversion is efficient and optimal only in a very narrow spectral sub-band, and on the other hand, because the total solar spectrum is too large to allow efficient operations using devices with a single collection junction.

Two ways to proceed are available.

*Maintaining the same unique mechanism of photons/electrons interaction, most efficiently exploited in cells in "TANDEM" mode (for example, with various materials of the GaAs family), by creating a stack of cells having complementary band gaps, which make it possible to perform photoconversion over a larger solar spectral range than single-junction converters, but which, in return, are characterized by a much more difficult current collection as well as by problems with light concentration.

*Introducing additional mechanisms, such as, for example, low-energy generation and multiplication of secondary electrons, with its numerous coupled mechanisms such as specific functional separation (local transformations of the material, local electronic transport, and collection of photogenerated electrons).

The present invention relates to a process for manufacturing all-silicon converters having improved efficiency due to giant photoconversion thanks to their sub-regions, sub-systems or substructures, such as, for example, a nanoscopic system of buried layers containing a silicon photovoltaic metamaterial. The manufacturing process leads to the device integrating the secondary low-energy generation and the multiplication of secondary electrons, with optimal collection of the photocarriers thus created.

The giant photoconversion represents a route to increase the efficiency of the conversion of light energy into electricity in devices with a single collection junction. The multiplication of low-energy electrons is the first mechanism in an indirect bandgap semiconductor, which has proved that silicon can be dramatically optimized in this way for the conversion of the solar spectrum into electricity.

The present invention is of particular importance because silicon, which largely dominates the photovoltaic industry (especially in its crystalline form), does not present resource problems given its abundance and ease of access in the earth's crust. Its extraction and its recycling do not pose significant problems of ecological nature, especially with regard to toxicity. In a way, the latest developments of silicon devices constituting giant photoconversion devices that are referred to in this invention represent a return to the first photovoltaic generation, and constitute excellent improvements of its founding concepts.

A conventional silicon photovoltaic cell production line can be quickly and cost-effectively transformed into a giant photoconversion cell production line.

5. SUMMARY DESCRIPTION

The present innovative process is nano-technological in nature. It utilizes the means, equipment, and technologies implemented for silicon. It is particularly important to state that all these means and operations are now fully mature and well-developed.

The specific steps of the manufacturing process include a partial transformation of the crystalline silicon into an optimal nanoscopic arrangement to form a device that makes it possible to improve the efficiency of the light-to-electricity conversion. All the parameters, processes, procedures and steps in the manufacture of giant photoconversion devices have been tested and validated separately during the manufacturing of about twenty test series.

The first manufacturing step consists in producing a conventional single-junction crystalline silicon cell. Phosphorus, used as dopant, is diffused during this step into the silicon which was previously homogeneously pre-doped, for example, with boron, with a density of approximately $5.10^{15}$ per cubic centimeter.

The nanoscopic modulation is buried within the crystalline silicon by an amorphizing implantation followed by a post-implantation thermal treatment. The incident ion beam amorphizes the crystal lattice of silicon locally in a zone having predetermined thickness and depth (in the order of tens of nanometers) with high precision thanks to the physical properties of the process. The resulting amorphization has no technical utility as such, and imperatively requires an additional thermal treatment, which will result in controlled local recrystallization in the form of solid phase epitaxy.

6. BENEFITS AND ADVANTAGES OF THE INVENTION

The present invention utilizes, for the production of photovoltaic cells, industrial machines that are used individually in the field of microelectronics and optoelectronics. It should nevertheless be emphasized that microelectronic methods are not directly compatible as such with giant photoconversion manufacturing processes, at least because of the active surface of the device.

The objective of the production process presented here is to use as widely as possible existing equipment, validated methods, and existing photovoltaic product manufacturing sites, but also those initially set up for manufacturing operations in microelectronics, optoelectronics or micro- and nanotechnologies.

Virtually all equipment, tools, machines, machine sets, are normally available on the market, as well as production facilities dedicated to electronics, photovoltaics and microelectronics. All the manufacturing steps of giant photoconversion GPC photovoltaic cells can be performed on existing equipment with rather minor adaptations. Large-scale manufacturing can be performed using suitably adapted, and thus, significantly cheaper dedicated machines meeting the well-defined and restrictive conditions of mass production of the converters.

7. OBJECTIVES OF THE INVENTION

This invention relates to a process for the production of all-silicon light-to-electricity converters incorporating nanosystems conditioned in specific arrangements within a crystalline silicon wafer for an optoelectronic application, for example, for GPC.

The production process developed and verified in practice leads to a complete nanoscopic modulation of the crystalline material, while avoiding conflicts between the different successive manufacturing steps.

As has been shown previously, the most specific problem concerns the concatenation of operations, performed consecutively directly one after the other, because some of these operations exclude each other if the order is not correctly respected.

Several methods and operations are available, which are well known individually in the field of microelectronics, but cannot be applied as such in a complete manufacturing cycle of a giant photoconversion device. Generally, the effective solution requires an original sequence of known operations, which must be parameterized according to the specificities of the secondary generation converters.

8. BRIEF DESCRIPTION OF THE DRAWINGS

FIG. 1: represents a general flowchart of all the important manufacturing steps of a giant photoconversion device.

FIG. 2: is a table showing the process step by step.

Figure 3:
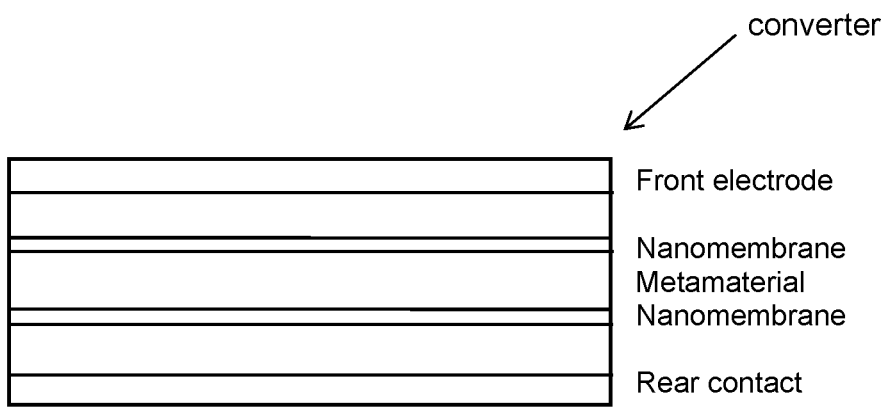

FIG. 3: a schematic view in cross-section of a light-to-electricity converter, as resulting from an implementation of a process according of the invention.

Figure 4:
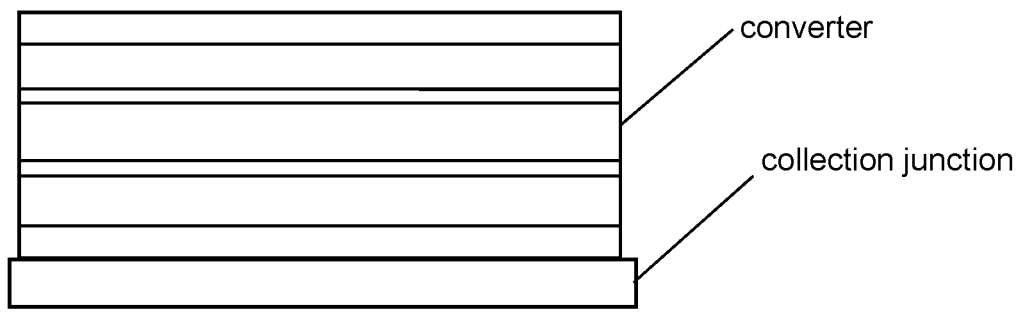

FIG. 4: a schematic front view of a giant photoconversion photovoltaic cell including a light-to-electricity converter and a collection junction, as resulting from an implementation of a process according to the invention.

9. FULL DESCRIPTION OF THE MANUFACTURING PROCESS

The invention encompasses and contains the bases and the general process, which are exposed below in accordance with the succession of the main steps. The following is a short but complete descriptive list, presented as an example of the main manufacturing specifications adapted to a complete industrial manufacturing process.

Generally, the production process in small series of giant photoconversion devices is based on a multi-step treatment of silicon wafers. The number of these steps depends, among other things, on the initial state of the silicon wafers, which are supplied in a more or less preconditioned state.

Examples of a few main process steps are mentioned below:

Choice of the silicon wafer thickness: the thickness must be adapted to all the technological operations from a mechanical standpoint.

Surface: The first manufacturing steps concern the surface quality of the silicon wafer (RCA, microelectronic purification), cold polishing of the silicon wafer surface to free it from native oxide.

Sacrificial oxidation: so-called deep oxidation (at 100 nanometers) followed by etching of the initial oxidation (95 nanometers), with preservation of a $SiO_2$ nanolayer (thickness of about 5 nanometers) as electronic passivation of the surface.

or total etching of the initial oxidation followed by 70 nm deposition serving as a nanolayer source of $P_2O_5$ diffusion, followed in turn by etching to a thickness of 5 nm.

Electronic passivation during manufacturing: preservation of a nanolayer (thickness of about 5 nanometers) of $SiO_2$ or $P_2O_5$ after oxidation and diffusion, to protect the silicon surface during implantation.

Diffusion of donors: diffusion of phosphorus from the nanolayer source of $P_2O_5$ to establish a P profile and create an interface of the PN junction.

Protective masks: intermittent protection of the front and rear surfaces between successive technological operations.

Implantation: amorphizing implantation of ions through protective surface nanolayers (thickness of about 5 nanometers), with a requirement of excellent geometric planarity characteristics.

Implantation masks: for discontinuous amorphization operations, corresponding to patterns of buried substructures.

Thermal treatment: annealing adapted to the regime of admissible temperatures corresponding to the deposition of the thermal energy required to modulate the transformed material through a solid phase epitaxy.

Conditioning of SEGTONs and SEG-MATTER: slowed-down solid phase epitaxy ensuring the calibration of active subsystems.

Underground substructures: Active subsystems inserted in the emitter according to the confirmed converter architecture.

Electronic passivations: passivation and electronic protection layers deposited after the conditioning processes of the SEGTONs and SEG-MATTER.

Rear surface: creating an acceptor profile (B) by diffusion or by implantation to form a BSF (English acronym for Back Surface Field); electronic passivation; rear mirror; contact grid.

Rear mirror: system of $SiO_2$/Al layers on the rear face for optical trapping.

Annealing and contact conditioning.

In the following, a few selected examples of the entire manufacturing process are described in correctly arranged sequences of operations, which are already known individually, especially in microelectronics, but must be parameterized according to the specificities of a production cycle of a giant photoconversion device.

Examples of Sequence of Operations of a Manufacturing Cycle 9.1 Pre-Doped Silicon Wafer, Preferentially with Boron
    *Monocrystalline silicon wafer CZOCHRALSKI-CZ-Si or with FZ-Si float zone.
    *Phosphorus (P) doping, preferentially in the order of $10^{18}$ per cubic centimeter, with boron (B) pre-doping at usual concentration in the order of $10^{15}$ per cubic centimeter.
    *Front and rear face cleaned, but not necessarily polished.
    *Crystalline orientation <100>.
9.2 Cleaning
    *RCA bath in a chemical cleaning station.
    *Cleaning by sacrificial thermal oxidation at a temperature of 850° C. for approximately 2 hours leading to a sacrificial $SiO_2$ layer having a thickness of from 50 to 100 nanometers.
9.3 Thermal Oxidation
    In an oxygen ion diffusion oven.
9.4 Formation of a Field at the Rear Face
    *By implantations of boron ions with a relatively low energy at a few degrees of offset angle with respect to the vertical, to avoid ion channeling.
    *The penetration depth comes from the implantation energy, which is precisely determined by simulations using software like SRIM/TRIM; for example, 25 keV through a SiO$_2$ passivation layer having a thickness of 100 nanometers, with the dose: 5–10×10$^{14}$ per square centimeter.

9.5 Front Face Formation, n-Type Doping Diffusion
  *Etching of the protective SiO$_2$ passivation layer.
  *Deposition of the surface source of phosphorus diffusion, for example, a nanolayer of P$_2$O$_5$.
  *Diffusion at so-called low temperature (<1000° C.) of phosphorus from the surface source.
  *Formation of the PN junction and of the emitter.

9.6 Front Face Operations—Ion Implantation
  *Etching of the P$_2$O$_5$ diffusion source layer to 5 nanometers thick to form a protective nanolayer.
  *Implantation of phosphorus ions through the protective P$_2$O$_5$ nanolayer, with an offset angle of a few degrees relative to the vertical, to avoid ion channeling.
  *The implantation depth depends on the implantation energy, determined by simulation, using a numerical code, for example SRIM/TRIM.
  *Amorphizing implantation energy: 30-200 keV.
  *The implantation dose is established below 10$^{15}$ ions per square centimeter.

9.7 Thermal Treatment
  *First thermal treatment applied to reduce the thickness of the amorphized nanolayers and reciprocally dilute amorphized inclusions in the crystalline phase and crystalline inclusions in the amorphized phase within the amorphized-crystalline phase transition zone.
  *Annealing thermal cycle—formation and conditioning of buried substructures composed of amorphizations and of systems of transformed and specifically structured crystalline Si nanolayers.
  Note: The post-implantation thermal treatment that follows a so-called direct amorphization is significantly simplified and has an improved thermal budget particularly suitable for serial mass production.
  According to this thermal treatment, the annealing temperatures are up to 700° C., which proves particularly favorable for the neutralization or heal of practically all extensive post-implantation structural defects, in order to obtain a more efficient material.
  For example, the process is carried out in the same way by adjusting the annealing temperature and the thermal cycle to the quality of amorphization.

9.8 Reactive Ion Etching (RIE) or Chemical Etching
  *Objective: remove the protective SiO$_2$ passivation layer (100 nanometers) according to a pattern to allow metallization by inductively coupled plasma etching (RIE).
  *Chemical etching.
  *A 5-nanometer thin layer is always preserved to protect the surface of the semiconductor; instead of SiO$_2$, it is possible to use the P$_2$O$_5$ that remains after the phosphorus diffusion process.

9.9 Implantation Masks—Photolithography Example
  *Objective: embed discontinuous amorphized substructures by amorphizing implantations through an implantation mask with different patterns and geometries according to the requirements imposed by the electronic transport.
  *Conventional realization with a photolithographic mask and illumination by a mercury vapor lamp.
  *The operation has many intermediate steps using masks with different patterns.
  *Covering with photoresist to protect the lower and upper faces in an intermediate manner.
  *Exposure to light: all the reactions mentioned above are induced by light.
  *Chemical processes: removal of fragments according to the selected patterns.

9.10 Ion Implantation for Wide Defocused Beam Amorphization, So-Called Direct Amorphization The conventional amorphization using a focused ion beam scanning the surface of the Si wafer inevitably introduces numerous structural defects. As such, this operation is not usable for the industrial manufacture of converters with secondary generation. The disqualifying aspects can be summarized as follows: poor control of the modulation of the material during the local impact of the ion beam and, consequently, of its post-implantation annealing; exaggerated requirements regarding the thickness of the initial amorphization to keep sufficient room for performing the healing recrystallization; severe limitations on the design and architecture of the converter because of the location of sub-structures buried within the crystal lattice; obstructions to electron transport around the nanostructures buried within damaged material; complications concerning the collection of both secondary and primary charge carriers.

It is known to persons skilled in the art that a post-implantation thermal treatment heals a few types of structural defects. For reasons imposed by the conditions of manufacture and the packaging of the SEG-MATTER, this treatment is performed in a well-delimited range of suitable temperatures and with a reasonable thermal budget from the manufacturing standpoint.

There are various combinations that lead to the emitter structure of the GPC converter using diffusion and/or implantations of doping impurities.

In the first case (phosphorus implantations), both the dopant profile and the front surface electric field (FSF), as well as the modification of the crystalline structure, are the result of ion implantations (preferably phosphorus with regard to amorphization).

In the second case (diffusion of doping impurities), the profile of the dopant is made by diffusion (preferably phosphorus), while the modification of the crystalline structure is the result of ion implantation (preferably phosphorus or silicon).

The modification of the crystalline structure compliant with industrial requirements should be:
  *Made by an ion implanter with wide defocused beam, securely stable and homogeneous, ensuring industrially useful amorphization (direct amorphization).
  *Implantation of phosphorus or silicon made with energies of 80-180 keV and with a density of 6 to 10×10$^{14}$ ions per square centimeter.
  *In the case where the phosphorus diffusion has been made beforehand, in order to obtain buried amorphization, silicon ions can be implanted instead of phosphorus ions.

9.11 Post-Implantation Thermal Treatment Cycle

The low thermal budget treatment is substantially shorter than 30 minutes at a temperature of about 500° C. in a tray oven, followed by progressive cooling. In some special cases, a short-sequence thermal cycle is possible.

9.12 Metallization of Rear Contacts

A superposition of the effects of optical confinement (SiO$_2$/Al mirror) and of collection at the rear face by a comb combined with a full-surface contact in aluminum.

9.13 Metallization of the Front Contacts

This concerns, for example, multilayer grid metallization: titanium/palladium/silver.

9.14 LPCVD or SiO$_2$ Deposition by Cathode Sputtering

Objective of the LPCVD: complement the basic SiO$_2$ layer having a thickness of 5 nanometers by a complete protection SiO$_2$ layer of about 100 nanometers (to ensure an efficacious electronic passivation). It is made, for example, in a tube of a suitable material, brought to and stabilized at 420° C. for 20 minutes; the deposition process lasts 5 minutes.

Objective of the cathode sputtering: complement the $SiO_2$ protection layer of about 5 nanometers by a layer of $SiO_2$ of 100 nanometers (to ensure an efficacious electronic passivation):

*The operation is performed at room temperature
*The pressure is $2\times10^{-3}$ mb
*The power is 200 W
*The distance to the targeted silicon wafer is 100 nanometers
*The duration of the operation is in the order of 13 minutes 10. Production Process in Small Series of Giant Photoconversion Devices—Multi-Stage Treatment of Silicon Wafers The number of processing steps depends inter alia on the initial state of the purchased silicon wafers. The main manufacturing steps concern:

Surface: the required surface quality of the silicon wafer can be obtained by RCA treatment, microelectronic purification, cold polishing to free it from native oxide.

Thickness of the silicon wafer: must be adapted to all the subsequent technological operations.

Sacrificial oxidation: deep oxidation (at 100 nanometers), etching of the initial oxidation (95 nanometers), preservation of a nanolayer as protective nanolayer (thickness of about 5 nanometers) or of the pure silicon surface itself, ready for a $P_2O_5$ deposit as the nanolayer source of P diffusion.

Protective masks: protected surface between successive operations, as well as amorphizing implantation masks corresponding to substructure patterns.

Back surface: p-type profile, B acceptor profile by diffusion or implantation, BSF, passivation, rear mirror, contact grid. Front surface: n-type profile, P donor profile by diffusion from the source in the form of a $P_2O_5$ nanolayer, PN junction interface.

Buried substructures: active substructures inserted into the emitter and having excellent geometric planarity characteristics, concept of the particular converter architecture.

Implantation: implantation of ions through the protective nanolayer (thickness of about 5 nanometers).

Thermal treatment: adapted deposition of thermal energy to modulate and condition the transformed material.

Conditioning of SEGTON and SEG-MATTER: solid phase epitaxy with calibration of the active subsystems in their environment.

Rear mirror: Rear mirror of $SiO_2$/Al on the rear face for optical trapping. Contacts activation annealing.

11. Production Process in Small Series of Giant Photoconversion Devices—Insertion of the Nanoscopic Systems into Silicon Wafers—Example of a Cycle with Non-Mutually Exclusive Sequences Example of operations leading to the insertion of nanoscopic systems in an all-silicon light-to-electricity giant photoconversion device; main steps and their characteristics:

*silicon used: CZ or FZ silicon wafer having a <100> crystallographic orientation,
*thickness of the silicon wafer used: approximately 150-500 micrometers,
*diameter of the silicon wafer used: 4, 6 or 12 inches,
*p-type pre-doping: homogeneous density of boron with a density of about $N_a \sim 1-5.10^{15}$ $cm^{-2}$—the operation must leave the maximum useful lifetime of minority carriers in the base of the converter (avoiding activation of unintentional impurities and defects),
*sacrificial oxidation of 50 nanometers at a temperature below 100° C.,
*first implantation (BSF) on the rear face with boron, at a density of $10^{15}$ $cm^{-2}$, with a maximum density profile at the surface/interface, except in the alignment zone (using the mask of the metal rear grid),
*etching of the $SiO_2$ from the front face, using HF buffer, except in the alignment zone,
*pre-deposition on the front face of a phosphorus source to carry out n-type doping by diffusion,
*the low-temperature diffusion profile is determined in a predictive manner by a simulation software, for example, ATHENA (registered trademark),
*second implantation of phosphorus on the front face, energy: 50-180 keV, dose $8.10^{14}$ $cm^{-2}$, except on the alignment zone (using the implantation masks),
*thermal treatment cycle determined predictively by a simulation code,
*partial etching by chemical stripping of the $SiO_2$ on the rear face, respecting the pattern of the contact fingers using a mask,
*metallization of the rear face with a 1-micron aluminum layer,
*etching of the alignment pattern on the rear face (one mask for the alignment),
*slow etching of the $SiO_2$ layer on the front face using $HF:H_2O$,
*three-layer metallization of the front face grid: Ti/Pd/Ag,
*etching of the metallized layer of the upper face in the alignment zone (two masks for the alignment),
*infrared alignment,
*etching of the metallized layer of the front face (mask of the front face grid).

12. Production Process in Small Series of Giant Photoconversion Devices—Example

A: Implantation, Amorphization and n-Type Doping Using Phosphorus Ions—Example of a Cycle with Non-Mutually Exclusive Sequences A. Implantation Only An exemplary solution of the process based solely on ion implantations, characterized by the following steps:

1) RCA cleaning.
2) Thermal oxidation 1000 Å.
3) Implantation No. 1: boron through the rear face and the thermal oxide 1000 Å.
4) Resin deposition on the rear face.
5) Photolithography of the rear face and calibration figure (mask 1).
6) Thinning of the front panel, to 50 Å.
7) Removal of the resin protection on the rear face.
8) Implantation mask applied onto a layer of polysilicon having a thickness of 0.2 micrometers.
9) Photolithography of different fingers with different spacings on polysilicon (100, 200 micrometers, all having an identical width of 500 micrometers (mask 6).
10) Implantation No. 2: implantation of amorphizing phosphorus in channel 0. 180 keV, $7.10^{14}$ At/$cm^2$.
11) Total removal of the polysilicon.
12) Implantation No. 3 with an overdoping profile; phosphorus is used for the channel of the front face, with the following characteristics: 0.25 keV, $7.10^{14}$ At/$cm^2$.
13) Post-implantation thermal treatment.
14) Treatment of two sets of silicon wafers in a "perfect" parallel diffusion mode.
15) Intermediate protection of the front face.
16) Photolithographic etching of the grid finger on the rear face.

17) Photolithographic etching of the 1000-Å $SiO_2$ contact finger.

18) Removal of the protective resin from the front face.

19) Total treatment of the rear face of the silicon wafer with a 2-micrometer aluminum deposit.

20) Resin protection of the rear face.

21) Photolithography of the front face comb (mask 3).

22) Lithography of the comb by etching 50 Å of $SiO_2$.

23) Removing the resin protection from the rear face.

24) Etching the contacts (mask 4) for removal.

25) Deposition of a double layer Ti/Au—150 microns/1 micron.

26) Removal by lifting (lift-off).

27) Deposition of $SiO_2$ by CVD or cathode sputtering on the front face.

28) Protection of the rear face with resin.

29) Photolithographic etching of the front face contact (mask 5).

30) Oxide-assisted photolithographic etching of the front face contact.

31) Removal of the protective resin on the rear face.

32) Annealing of the contacts under $N_2H_2$ atmosphere for characterization during treatment.

33) Protection with resin on the front face for cutting.

34) Cutting the cell on the silicon wafer by sticking it on blue adhesive tape.

13. Production Process in Small Series of Giant Photoconversion Devices—Example

B: n-Type Doping Using Phosphorus Diffusion, Amorphizing Implantation Using Phosphorus Ions—Example of a Cycle with Non-Mutually Exclusive Sequences B. Diffusion and Implantation An exemplary solution of the process based on diffusion and implantation of ions, characterized by the following steps:

1) RCA cleaning.

2) Thermal oxidation 1000 Å.

3) Implantation No. 1: boron on the rear face through the 1000-Å thermal oxide layer.

4) Protection of the rear face with resin.

5) Lithographic etching of the active zone and of the calibration figure of the front face (mask 1).

6) Total removal of $SiO_2$.

7) Removal of the protective resin on the front face.

8) Deposition of the $P_2O_5$ oxide by diffusion source and use of a passivation layer.

9) P diffusion.

10) Thinning of the P oxide on the front face.

11) Annealing of the diffused P.

12) Implantation mask, deposition of a layer of polysilicon having a thickness of 0.2 micrometers.

13) Photolithographic etching of the polysilicon: several spacings between fingers 100, 200, 500 micrometers. They all have the same width of 500 nanometers (mask 6).

14) Amorphizing implantation with phosphorus on the front face in a channel at 0 degree angle with 180 keV and $7.10^{14}$ At/$cm^2$.

15) Total removal of the polysilicon.

16) Annealing after implantation.

14. Production Process in Small Series of Giant Photoconversion Devices—Example of Thermal Oxidation The thermal oxidation of the GPC cell can be carried out in an oxidation oven, exploited in microelectronics, reaching 1000° C. under $N_2$, $O_2$, $H_2$, HCl and forming an oxide layer having a thickness of 0.5 to 1.6 μm.

15. Production Process in Small Series of Giant Photoconversion Devices—Example of Ion Beam Current Implantation characteristics with focused beam require a beam current of from 3 microamperes to 2 milliamperes, the acceleration voltage ranging from 5 to 200 kV, up to 125 atomic mass, with the ability to process silicon wafer samples having diameters ranging from 1 $cm^2$ to 6 inches.

16. Production Process in Small Series of Giant Photoconversion Devices—Example of Creation of a Front Surface Field The creation of an intrinsic electrostatic field on the front face of the silicon wafer to manufacture a GPC cell can be performed using shallow implantation of phosphorus ions (depth <1.0 μm). This second implantation of the GPC cell can be done with the same ion implanter operating in the lower energy range forming the shallow impurity profile.

17. Production Process in Small Series of Giant Photoconversion Devices—Example of a Thermal Treatment Based on Thermodynamic Effects of Crystallization The first annealing of the GPC cell at about 500° C. should generally be followed by the second annealing operation which is cyclical with heating and cooling steps. The cycle can be performed in the same oven as that used for the first annealing step.

18. Production Process in Small Series of Giant Photoconversion Devices—Example of Values to Start the Procedure by Iterative Adjustment of the GPC Cell Manufacturing Machine by a Specific Characterization Process

| Table of starting values | | |
|---|---|---|
| Selected manufacturing machine | Implemented functions | Values of parameters |
| High temperature oven | Thermal oxidation | Oxygen ion diffusion at a temperature <1000° C. (tolerance 3%) Oxide thickness 600 Å |
| Ion implanter for wide defocused beam implantation | Implantation of boron ions (rear face) | Dose $5 \times 10^{14}$ per square centimeter (tolerance 3%) Power 25 keV (tolerance 1%) Off-axis by a few degrees (tolerance 0.5 degrees) |
| Ion implanter for wide defocused beam implantation | Implantation of phosphorus ions (front face) | Dose <$10^{15}$ ions per square centimeter (tolerance 3%) Power 20 keV (tolerance 1%) Passivation of the $SiO_2$ substrate, $P_2O_5$ thickness 5 nanometer |

-continued

Table of starting values

| Selected manufacturing machine | Implemented functions | Values of parameters |
| --- | --- | --- |
| | | Off-axis by a few degrees to avoid ion channeling for improved precision (tolerance 1 degree) |
| Oxidation oven | Front surface field Formation of P profile by diffusion | Temperature 850° C. (tolerance 3%) Duration 2 hours (tolerance 1%) |
| Microphotolithography | Covers certain portions of the sample to protect them from the implantation, optionally creating different geometries and shapes of amorphized layers | Covering with a photoresist agent to protect the untreated zones against the on-going procedure, for example, against the effects of the chemical wet micro-etching |
| Ion implanter for wide defocused beam amorphization | Implantation of phosphorus, boron or silicon ions | Power 180 keV (tolerance 10%) Phosphorus ion density $10^4$ by square centimeter (tolerance 10%) |
| Annealing with a cycling oven | Annealing | Duration 30 minutes (tolerance 10%) Temperature ≤500° C. (tolerance 10%) Rapid exposition to heat with cooling in $1/10$ second (tolerance 5%) |
| Reactive ion etching machine | RIE-treated zones selected for removal | a thin 5-nanometer layer of $SiO_2$ is preserved 80 nanometers are removed (tolerance 1%), HF solution that processes 80-nanometer per minute (tolerance 1%) 15 nanometers are removed by a mixture of water and buffer (1 milliliter) |
| LPCVD oven | Deposition of a 100-nm protective layer | Thickness 10 nm (tolerance 3%) |
| Cathode sputtering machine | Deposition of 100 nm of $SiO_2$ operating as protective layer | Ambient temperature, pressure $2 \cdot 10^{-3}$ torr (tolerance 3%) Power 200 W (tolerance 10%), distance to the target 100 nanometer (tolerance 3%) Duration 10 minutes (tolerance 3%) |

The initial values for the equipment selected for manufacturing were obtained with the CAD software CAM, which provides adjustment data at the beginning of the iterative process for the micro-manufacturing machine with a margin of error reduced by specificities of the metamaterial manufacturing and by adequate machinery.

19. Production Process in Small Series of Giant Photoconversion Devices—Examples of Nanoscopic Transformations of Crystalline Silicon into an Optimal Arrangement to Form Buried Active Subsystems The manufacturing process according to this invention constitutes a nanoscopic transformation of crystalline silicon into an optimal arrangement to form subsystems buried in the crystal lattice that make it possible to improve the efficiency of light-to-electricity conversion. All parameters, procedures and manufacturing steps of the GPC have been tested and validated separately and in combination during the manufacture of many test series.

To be useful in terms of light-to-electricity conversion, silicon must undergo a complex transformation that will shift from the structural defects being normally distributed in a rare, random and scattered manner to a structure composed of elementary units called SEGTONS of the ordered super-lattice, thus forming a metamaterial called SEG-MATTER. The most important aspects concern the nature, density and number of point defects properly positioned within the converter space.

To perform its functions, the nanolayer of metamaterial is integrated into a material (preferably crystalline silicon, c-Si), properly doped by n-type doping. This layer is bounded by two planar interfaces (nanomembranes) delimiting it according to an earlier invention.

The thickness of the metamaterial nanolayer (<c-Si>nanolayer) and the density of the grafted SEGTONs are self-controlled during manufacturing by the local mechanical stress (coming from dilatations between a-Si and c-Si), which are induced by, and result from, recrystallization cycles (solid phase epitaxy) occurring at suitable temperatures. Experiments (X-rays, LEED) show that on the side of the crystalline phase (well visible by available techniques), the final thickness of the nanolayer SEG-MATTER is in the order of 5 to 10 nanometers.

Keeping in mind all the individual steps, they are integrated into a single and complete industrial-type manufacturing process. As a result, the main features related to the SEG-MATTER concern:

a deep local transformation of the semiconductors (preferably c-Si), possible on a nanometric scale, which leads to a crystalline silicon metamaterial called SEG-MATTER, a high density ($10^{20}$ cm$^{-3}$) of the SEGTONs in the metamaterial, with a homogeneous distribution, uniform and stabilized composition of the SEG-MATTER nanolayers, sufficient quantities of all metamaterial nanolayers corresponding to the intensity of the incident photon flux, adapted spatial position of the SEG-MATTER system, which must be close to the place where there is the absorption of energetic photons (spatial optimization):

*proximity and/or unity of the absorption zone and secondary generation zones;

*maximum and optimized exposure surface (shapes and arrangements) for collision interactions with hot electrons.

The metamaterial nanolayer is designed to withstand and remain after treatments carried out at unusually relatively high temperatures (450-550° C. and 250-450° C.) for the divacancies, because of the maintenance of the local mechanical stress. This characteristic differs from the fact, well-known to persons skilled in the art that the divacancies recombine at temperatures below 250° C.

The most specific problems concern the concatenation of operations that follow each other consecutively, since some are mutually exclusive. For example, in the present invention, the temperatures of the successive procedures in the production cycle necessarily range stepwise from the highest toward the lowest, while respecting each of the steps described above.

Light-to-electricity converters containing the substructures (continuous or discontinuous) in the emitter have been described previously. One of the most important elements of the dedicated subregion, sub-system and substructure is a component that is artificial on a nanometric scale and that should be able to complement the conventional conversion with an improvement due to the new mechanisms.

This is ensured by an artificial material (SEG-MATTER), formed inter alia from well-defined building units, having a well-defined density and localized in a well-defined manner in the well-determined volume of the converter. To ensure the complete functionality of the conversion of the SEG-TONs and of the SEG-MATTER, a number of strict conditions must be met.

Generally, the solution requires specific sequences of known operations, which must be parameterized according to the physical and technological features of the process.

The manufacture of a GPC device requires the integration of a series of operations that are, on the one hand, well known in the photovoltaic and microelectronic technologies (operations, procedures, machines), but on the other hand, cannot to be applied as they are, because of their specific conditions related to the large active surfaces of the devices.

Manufacturing can be carried out using existing equipment with a few minor adaptations. Virtually all necessary machinery and tools have been tested and are normally available in the industry. The future large-scale manufacturing will be operational on dedicated, simpler, and significantly less expensive production machines.

For example, the structure of a test device contains an electronic passivation SiO$_2$ carried out by a low pressure vapor deposition method. The passivation layer has a thickness of 100 nanometers. The crystalline silicon doped with phosphorus has a thickness equal or lower than 170 nanometers, the layer strongly doped with amorphized silicon has a thickness of 20 nanometers, the PN junction is 1 micron below the surface (this value is not highly constraining). The amorphized layer is swollen, causing mechanical stress due to the discrepancy between the crystalline lattice and the amorphization.

The rear face contact can be made of aluminum and the front face electrodes can be made of silver or metal tri-layer.

The main originality of the invented manufacturing technology lies in the range of specific operations, as compared to the usual technology of crystalline Si cells, and in the organization of the manufacturing steps. The main constraints come from the fact that GPC sub-structures cannot be heated above 500° C.

Once the metamaterial layer has been manufactured, to create the passivation layer without heating too much, one must use chemical vapor deposition, which can be carried out at low temperature (which is not the case for thermal oxidation). Thus, the best way to proceed is to use a compromise:

firstly, perform a first thermal oxidation, then, thin the Sift layer by etching to 5 nanometers, create the nanostructured layer by wide defocused beam ion implantation, adjust the nanolayer system by annealing cycles, return to electronic passivation to increase its thickness by chemical deposition.

EXAMPLE

*material: CZ or FZ silicon in the form of wafers with a <100> crystallographic orientation,

*homogeneous density p-type pre-doping with boron of 1 to $5.10^{15}$ At per cubic centimeter,

*the useful lifetime of the minority carriers must be as long as possible (it depends on quality),

*diameter and thickness of the silicon wafer: 4, 6 or 12 inches, thickness 150-500 micrometers,

*thickness of the initial sacrificial oxidation layer expanded at a temperature below 1000° C.,

*first implantation at the rear face, with boron: $10^{15}$ At/cm$^2$, leading to a profile having its maximum on the surface except on the alignment zone,

*etching of the SiO$_2$ from the front face with HF buffer, except on the alignment zone,

*pre-deposition of a source of phosphorus diffusion on the front face,

*diffusion according to a profile determined by the prior simulation performed with the software, for example, ATHENA,

*second implantation of phosphorus on the front face, energy 180 keV, dose $8\times10^{14}$ At/cm2, except on the alignment zone; "direct" amorphization.

Thermal Treatment Cycle

*Partial etching of SiO$_2$ of the rear face, respecting the pattern of the contact fingers,

*metallization of the rear face; deposition of a 1-nm Al layer,

*etching of the rear face according to the alignment patterns (possibly with mask),

*Slow etching of the SiO$_2$ of the front face with HF:H$_2$O,

*Tri-layer metallization of the front face: Ti/Pd/Ag,

*etching of the metal of the face according to the pattern of the contact zone.

20. Machines that can be Used as References to Implement the Production Process According to the Present Invention The following list is a non-exhaustive example.

Machine for the reactive ion etching of the silicon wafer: inductively coupled plasma etching machines, for example the machine AVI21 TEC OMEGA 201 with RF inductive power of 600 W (13.56 MHz), RF clamping power of 600 W (13.56 MHZ), treatment temperature of from 10 to 20 degrees Celsius, and the possibility of using the following gases: $SF_6$, $CF_4$, $O_2$, $CHF_3$, AR, with cooling of the rear face of the GPC by helium;

Standard production photolithography equipment (standard workshop mask as instruments), which is only necessary in the case of a GPC with discontinuous substructures. The alignment mask is an example of the necessary instruments;

Ion implanter for the second treatment of the GPC cell;

Second annealing step for the GPC cell: oven identical to that used for the first annealing step with rapid temperature variation controllable by computer;

Cathode sputtering machine for the metallization of the rear contacts of the GPC cell, such as, for example, UNIVEX 450C, where the metal can be aluminum, the RF or DC power and the required vacuum limit being $1.10^{-7}$ torr;

VARIAN 3 6 16 machine for the metallization of the front contacts of the GPC cell with titanium, palladium or silver using an electron gun for evaporation, with a power of 6 kW, a cryogenic pump, and a minimum pressure of $5.10^{-7}$ bar;

Instrument for the creation of a 100-nanometer protective $SiO_2$ layer for the passivation of the GPC cell by an LPCVD oven, such as LPCVD6, whose characteristics are: maximum temperature 580° C., length of the tray area 50 cm, gas: $N_2$, $NH_3$, $SiH_4$, $SiH_2Cl_2$, $N_2O$;

Cathode sputtering machine for sputtering $SiO_2$ or ITO on the GPC cell, such as the ALCATEL 600, with a cryogenic pump, an RF or DC power source, and a pressure of $10^{-7}$ ton;

Machine for the final cleaning of the GPC cell for microelectronic circuits with class 100 atmospheric control, nitrogen dryers using ion-free water, a resistivity measurement function to measure the quality of the drying and cleaning between the different baths, the vapors being extracted from the bottom at the top of the device.

The present invention is naturally not limited to the embodiments described and shown but covers all variants, alternatives or changes that can be made or their equivalents used without departing from the spirit and scope of the invention.

The invention claimed is:

1. A production process of an all-silicon light-to-electricity giant photoconversion device having nanoscopic subsystems conditioned in specific arrangements within crystalline silicon, comprising:

performing localized nanoscale transformation of a crystalline silicon material, the performing of the transformation including:

performing ion implantation in a crystalline silicon material, followed by performing at least one sequence of thermal treatment resulting in solid phase epitaxy, wherein the ion implantation is performed at a predetermined density and depth by directing a wide defocused beam of an ion implanter through an implantation mask at a density of below $10^{15}$ cm$^{-2}$ and an energy in a range of from 30 to 200 keV, so as to obtain an amorphized nanolayer having a thickness of about 5 to about 10 nm located at a depth adapted for absorption of photons and generation of secondary electrons, wherein the nanolayer contains an ordered super-lattice of homogeneously distributed divacancies, and wherein the at least one sequence of thermal treatment resulting in solid phase epitaxy is performed so as to stabilize the divacancies by generating an increased mechanical stress resulting from dilatation during the solid phase epitaxy, so that the divacancies do not recombine at a temperature greater than 250° C., wherein the performing of the transformation creates an arrangement of a metamaterial nanolayer forming a crystalline superlattice system around amorphizations buried within a crystalline mass of the silicon material, according to the distribution and the depth determined by the ion implantation, the metamaterial nanolayer being delimited by nanomembranes, so as to improve the efficiency of the light-to-electricity conversion, by secondary generation by hot electrons.

2. The production process according to claim 1, wherein the performing of the localized nanoscale transformation comprises:

a) selecting the crystalline silicon material;
b) cleaning the crystalline silicon material;
c) performing thermal oxidation of the crystalline silicon material;
d) forming a back surface field (BSF) on a rear face of the crystalline silicon material;
e) forming a PN junction and an emitter by performing n-type doping diffusion on a front surface of the crystalline silicon material;
f) performing the ion implantation by performing implantation of phosphorus ions into a front face of the crystalline silicon material;
g) performing the at least one sequence of thermal treatment;
h) preparing the crystalline silicon material for an additional ion implantation by reactive ion etching (RIE) or chemical etching;
i) optionally, protecting some parts of the crystalline silicon material from the additional ion implantation by photolithography, so that all or part of the material as unprotected surfaces;
j) performing the additional ion implantation by performing implantation of phosphorus and/or silicon ions on the unprotected surfaces of the crystalline silicon material;
k) subjecting the crystalline silicon material to annealing;
l) performing metallization of the rear face of the crystalline silicon material; and
m) performing metallization of the front face of the crystalline silicon material.

3. The production process according to claim 1, wherein the performing of the ion implantation is carried out by stabilizing and controlling the wide defocused beam so as to produce an extended defocused ion spot.

4. The production process according to claim 2, comprising:

before the performing of the thermal oxidation c), subjecting surfaces of the crystalline silicon material to cold polishing to free it from any native oxide;

in the forming of the PN junction e), performing diffusion from a nanosource of $P_2O_5$, according to a P profile, to form a $P_2O_5$ surface nanolayer;

in the performing of the additional ion implantation j), performing implantation of ions through the surface nanolayer; and in the performing;

of the annealing k), performing the annealing resulting in solid phase epitaxy so as to release and further stabilize the divacancies.

5. The production process according to claim 2, wherein:

in the selecting of the crystalline silicon material a) the crystalline silicon material is a CZ or FZ silicon wafer having a <100> crystallographic orientation, a thickness in a range of from 150 to 500 micrometers, and a diameter of 4 inches or more, wherein the performing of the ion implantation f) is preceded by the following:

performing a p-type rear face pre-doping comprising a homogeneous density of boron, with a density of about $N_a\sim1\text{-}5.10^{15}$ per square centimeter, performing sacrificial oxidation of front face of 50 nanometers at a temperature below 100 degrees Celsius,.

performing a first implantation (BSF) on the rear face of the silicon wafer with boron, with a maximum density profile at a surface/interface, except in an alignment zone, performing etching of $SiO_2$ from the front face of the silicon wafer, HF buffer, except in the alignment zone performing pre-deposition on the front face of the silicon wafer of a phosphorus source to carry out n-type doping by diffusion, performing a second and implantation of phosphorus on the front face of the silicon wafer, except on the alignment zone, performing partial etching by chemical stripping of $SiO_2$ on the rear face of the silicon wafer, respecting an alignment pattern of contact fingers, wherein the performing of the metallization the rear face with of the crystalline silicon material ) is carried out so as to form an aluminum layer, followed by etching of the alignment pattern on the rear face, and wherein the performing of the metallization of the front face of the crystalline silicon material m) is preceded by performing slow etching on the front surface of the crystalline silicon material so as to remove any $SiO_2$ layer, and is performed so as to obtain a tri-layer metallized layer of a front face grid with Ti/Pd/Ag, followed by etching of the tri-layer metallized layer in the alignment zone, infrared alignment, and etching of the tri-layer metallized layer.

6. The production process according to wherein the performing of the ion implantation comprises:

1) performing RCA cleaning,
2) performing thermal oxidation to obtain a thermal oxide layer to a depth of 1000 Å,
3) performing a first implantation of boron through the rear face of the crystalline silicon material and the thermal oxide layer,
4) depositing resin on the rear face,
5) performing photolithography of the rear face to obtain a calibration figure,
2 6) performing thinning of the front face of the crystalline silicon material, 50 Å,
7) removing the resin on the rear face,
8) applying a polysilicon layer having a thickness of 0.2 micrometers on the crystalline silicon material, and applying the implantation mask on the polysilicon layer,
9) performing photolithography of different fingers with different spacings on the polysilicon layer, all the fingers having an identical width of 500 micrometer.
10) performing a second ion implantation of amorphizing phosphorus, 180 keV, $7.10^{14}$ At/cm$^2$,
11) removing all of the polysilicon layer, and
12) performing a third implantation of phosphorus with an overdoping profile, 0.25 keV, $7.10^1$At/cm$^2$, and wherein the method additionally comprises, after the performing of the at least one sequence of thermal treatment:

13) providing a first protective resin for protection of the front face of the crystalline silicon material,
14) performing photolithographic etching of a grid comprising contact fingers on the rear face,
15) performing photolithographic etching of contact fingers having a thickness of 1000 Å,
16) removing the first protective resin from the front face,
17) depositing an aluminum layer on the rear face having a depth of 2 mircometers,
18) providing a second protective resin for protection of the rear face,
19) performing photolithography of a grid on the front face,
20) performing photolithogrpahy etching of the comb by etching 50 Å of $SiO_2$,
21) removing the second protective resin from the rear face,
22) etching contacts for removal,
23) depositing a double layer Ti/Au-150 microns/1 micron,
24) performing lifting (lift off),
25) depositing a layer of $SiO_2$ by CVD or cathode sputtering on the front face,
26) providing a third protective resin of protection of the rear face,
27) performing photolithographic etching of the front face contacts,
28) performing oxide-assisted photolithographic etching of the front face contact,
29) removing the third protective resin on the rear face, and
30) performing annealing of the contacts under $N_2H_2$.

7. The production process according to claim 2, wherein the performing of the thermal oxidation c, is carried out in an oxidation oven, designed for microelectronics, reaching 1000° C. under $N_2$, $O_2$, $H_2$, HCl in gaseous form and an oxide layer having a thickness ranging from 0.5 to 1.6 microns.

8. The production process according to claim 2, wherein the forming of the back surface field (BSF) d) comprises performing boron ion implantation by a boron ion implanter.

9. The production process according to claim 2, wherein the performing of the ion implantation f) is performed using a beam current of 3 microamperes or more, an acceleration voltage ranging from 5 to 200 keV, up to 125 atomic mass, with a capacity to process silicon wafer samples having diameters of 1 cm$^2$ or more.

10. The production process according to claim 3, comprising forming a front surface field (FSF) by performing ion implantation comprising performing phosphorus ion implantation by a phosphorus ion implanter.

11. The production process according to claim 2, wherein the performing of the additional ion implantation j) is carried out by reactive ion etching (RIE) with an inductively coupled plasma, an RF induction power of 600W at 13.56 MHz, an RF clamping power of 600 W, a processing temperature of 10 to 20 degrees Celsius, and a gas selected from the group consisting of $SF_6$, $CF_4$, $O_2$, $CHF_3$, Ar, and mixtures of two or more thereof, with cooling of the rear face of the crystalline silicon material by helium.

12. The production process according to claim 6, comprising performing an additional ion implantation after the performing of the ion implantation, wherein the performing of the ion implantation and the performing of the additional ion implantation are carried out by the same ion implanter.

13. The production process according to claim 2, herein the performing of the metallization of the rear face of the crystalline silicon material l) is performed by a cathode sputtering machine.

14. The production process according to claim 2, comprising forming a protective layer having a thickness of at least 100 nanometer, made of $SiO_2$ for electrical passivation, using an LPCVD oven with a gas selected from the group consisting of Na, $NH_3$, $SiH_4$, $SiH_2Cl_2$, $N_2O$, and mixtures of two or more thereof.

15. The production process according to claim 2, comprising performing a final cleaning with a class 100 cleaner, designed for atmospheric control, and drying by a nitrogen dryer with ion-free water.

16. The production process according to claim 3, wherein the performing of the at least one sequence of thermal treatment g) is carried out at about 500° C., and the performing of the annealing k) comprises heating and cooling steps, wherein the performing of the at least one sequence of thermal treatment g) and the performing of the annealing k) are carried out in a same oven.

17. The production process according to claim 2, wherein the performing of the at least one sequence of thermal treatment g) includes at least one thermal treatment at a temperature range up to of 700° C.

18. The production process according to claim 2, comprising depositing a 100-nanometer protective $SiO_2$ layer for electronic passivation of the giant photoconversion device, the layer being deposited by LPCVD at a temperature below 350° C., wherein a gas of the LPCVD is selected from the group consisting of $N_2$, $NH_3$, $SiH_2Cl_2$, $N_2O$, and mixtures of two or more thereof.

19. A light-to-electricity converter, comprising an all-silicon light-to-electricity giant photoconversion device as resulting from the process according to claim 1.

20. A giant photoconversion photovoltaic cell, comprising at least one light-to-electricity converter according to claim 19 and a collection junction.

21. The production process according to claim,
wherein the performing of the ion implantation comprises:
1) performing RCA cleaning,
2) performing thermal oxidation to form a thermal oxide layer having a thickness of 1000 Å,
2 3) performing a first implantation of boron on the rear face of the crystalline silicon material through the thermal oxide layer,
2 4) providing the first protective resin for protection of the front face.
5) performing lithographic etching of an active zone and of calibration figure of the front face,
6) removing any $SiO_2$ from the front face,
7) removing the first protective resin on the front face,
8) depositing $P_2O_5$ oxide on the front face from a diffusion source through a passivation layer,
9) performing P diffusion,
10) thinning of $P_2O_5$ oxide on the front face,
11) performing annealing of the P diffused in the performing of the P diffusion 9),
12) providing the implantation mask, by deposition of a layer of polysilicon having a thickness of 0.2 micrometers,
13) performing photolithographic etching of the layer of polysilicon, providing several spacings between fingers, the spacings being selected from the group consisting of 100, 200, and 500 micrometers, the fingers have a width of 500 nanometers,
14) performing a second implantation of phosphorus on the front face, with 180 keV and $7.10^{14}$ At/$cm^2$, and
2 15) removing entirely the layer of polysilicon.

* * * * *